(12) United States Patent
Lin

(10) Patent No.: US 7,336,084 B2
(45) Date of Patent: Feb. 26, 2008

(54) DELAY LOCK CIRCUIT HAVING SELF-CALIBRATING LOOP

(75) Inventor: Feng Lin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 131 days.

(21) Appl. No.: 11/215,987

(22) Filed: Aug. 31, 2005

(65) Prior Publication Data

US 2005/0285605 A1 Dec. 29, 2005

Related U.S. Application Data

(62) Division of application No. 10/782,577, filed on Feb. 19, 2004, now Pat. No. 7,009,407.

(51) Int. Cl.
*G01R 35/00* (2006.01)

(52) U.S. Cl. .................. 324/601; 324/76.53; 324/76.82

(58) Field of Classification Search ................ 324/601, 324/76.53, 76.82
See application file for complete search history.

(56) References Cited

U.S. PATENT DOCUMENTS

| | | | |
|---|---|---|---|
| 5,990,716 | A | 11/1999 | Chen |
| 5,994,938 | A | 11/1999 | Lesmeister |
| 6,130,552 | A | 10/2000 | Jefferson et al. |
| 6,137,325 | A | 10/2000 | Miller, Jr. |
| 6,281,726 | B1 | 8/2001 | Miller, Jr. |
| 6,411,142 | B1 | 6/2002 | Abbasi et al. |
| 6,490,207 | B2 | 12/2002 | Manning |
| 6,636,093 | B1 | 10/2003 | Stubbs et al. |
| 6,727,739 | B2 | 4/2004 | Stubbs et al. |
| 6,759,883 | B2 | 7/2004 | Gomm |
| 6,774,687 | B2 | 8/2004 | Gomm et al. |
| 6,774,690 | B2 | 8/2004 | Baker |
| 6,777,995 | B1 | 8/2004 | Harrison |
| 6,781,861 | B2 | 8/2004 | Gomm et al. |
| 6,791,381 | B2 | 9/2004 | Stubbs et al. |
| 6,798,259 | B2 | 9/2004 | Lin |
| 6,803,826 | B2 | 10/2004 | Gomm et al. |
| 6,809,974 | B2 | 10/2004 | Jones et al. |
| 6,809,990 | B2 | 10/2004 | Thomann et al. |
| 6,819,151 | B2 | 11/2004 | Mikhalev et al. |
| 6,819,603 | B2 | 11/2004 | Jones et al. |
| 6,839,301 | B2 | 1/2005 | Lin et al. |
| 6,839,860 | B2 | 1/2005 | Lin |

(Continued)

OTHER PUBLICATIONS

U.S. Appl. No. 10/782,577 Notice of allowance mailed Oct. 5, 2005, 4 pgs.

(Continued)

*Primary Examiner*—Vincent Q. Nguyen
(74) *Attorney, Agent, or Firm*—Schwegman, Lundberg & Woessner, P.A.

(57) ABSTRACT

A delay lock circuit includes a measuring path, a forward path, and a feedback path. The measuring path samples a pulse with a reference signal in a measurement to obtain a measured delay. The forward path delays the reference signal based on the measured delay to generate an internal signal. The feedback path includes a calibrating unit for generating the pulse based on a plurality of feedback signals generated from the reference signal. The delay lock circuit further includes a monitoring unit for monitoring the measurement. Based on the monitoring, the monitoring unit enables the calibrating unit to conditionally adjust the width of the pulse.

34 Claims, 9 Drawing Sheets

U.S. PATENT DOCUMENTS

| | | |
|---|---|---|
| 6,842,399 B2 | 1/2005 | Harrison |
| 6,845,459 B2 | 1/2005 | Lin |
| 6,850,107 B2 | 2/2005 | Gomm |
| 6,868,504 B1 | 3/2005 | Lin |
| 6,876,239 B2 | 4/2005 | Bell |
| 7,009,407 B2 | 3/2006 | Lin |
| 7,102,361 B2 | 9/2006 | Lin |
| 2002/0167346 A1* | 11/2002 | Yoon et al. ................. 327/158 |
| 2002/0180499 A1* | 12/2002 | Kim et al. ................... 327/158 |
| 2003/0095009 A1 | 5/2003 | Gomm et al. |
| 2003/0098731 A1 | 5/2003 | Tabatabaei et al. |
| 2004/0000934 A1* | 1/2004 | Jeon ............................ 327/115 |
| 2004/0156245 A1 | 8/2004 | Gomm et al. |
| 2005/0057291 A1 | 3/2005 | Nguyen et al. |
| 2005/0184739 A1 | 8/2005 | Lin |
| 2005/0285606 A1 | 12/2005 | Lin |

OTHER PUBLICATIONS

U.S. Appl. No. 10/782,577, Response filed Sep. 19, 2005 Non-Final Office Action mailed Jun. 17, 2005, 10 pgs.

U.S. Appl. No. 11/217,022 Non-Final Office Action mailed Dec. 30, 2005, 6 pgs.

U.S. Appl. No. 11/217,022 Notice of allowance mailed Apr. 17, 2006, 5 pgs.

U.S. Appl. No. 11/217,022, Response filed Mar. 24, 2006 Non-Final Office Action mailed Dec. 30, 2005, 7 pgs.

US 6,249,165, 06/2001, Harrison (withdrawn)

* cited by examiner

US 7,336,084 B2

DELAY LOCK CIRCUIT HAVING SELF-CALIBRATING LOOP

This application is a Divisional of U.S. application Ser. No. 10/782,577, filed Feb. 19, 2004, now U.S. Pat. No. 7,009,407, which is incorporated herein by reference.

FIELD OF INVENTION

The present invention relates generally to signal generating circuit, and more particularly, to delay lock circuits.

BACKGROUND

Many semiconductors devices such as memory devices use delay lock circuits to generate an internal signal based on an external signal.

Some delay lock circuits use a feedback signal to obtain a measurement during an initialization. The feedback signal is a delayed version of the external signal. The measurement allows the delay lock circuits to synchronize the internal signal with the external signal.

Variations in elements such as manufacturing process, voltage, and temperature (PVT) may affect the measurement during the initialization. For example, the PVT variations may cause the delay lock circuits to spend more time to obtain the measurement, thereby increasing the time for the delay lock circuits to put the internal and external in synchronization. In some cases, the PVT variations may cause the delay lock circuits to fail to get the measurement during the initialization, leading to malfunction of the device.

SUMMARY OF THE INVENTION

The present invention provides circuits and methods for generating an internal signal based on an external signal in which the circuits are less sensitive to PVT variations.

One aspect includes a delay lock circuit having a measuring path for receiving a reference signal to sample a pulse to obtain a measured delay. The delay circuit also includes a forward path for delaying the reference signal based on the measured delay to generate an internal signal. The delay lock further includes a feedback path connected to the measuring path and the forward path. The feedback path has a calibrating unit for generating the pulse based on a plurality of feedback signals generated from the reference signal. The calibrating unit is configured to conditionally adjust a pulse width of the pulse to allow the measured delay to be obtained during the initialization.

Another aspect includes a method of generating an internal signal. The method generates a pulse with a pulse width. The pulse is sampled with a reference signal in an initialization to obtain a measured delay. During the initialization, the method conditionally adjusts the pulse width. The method delays the reference signal based on the measured delay to generate the internal signal.

DETAILED DESCRIPTION OF THE EMBODIMENTS

Figure 1:
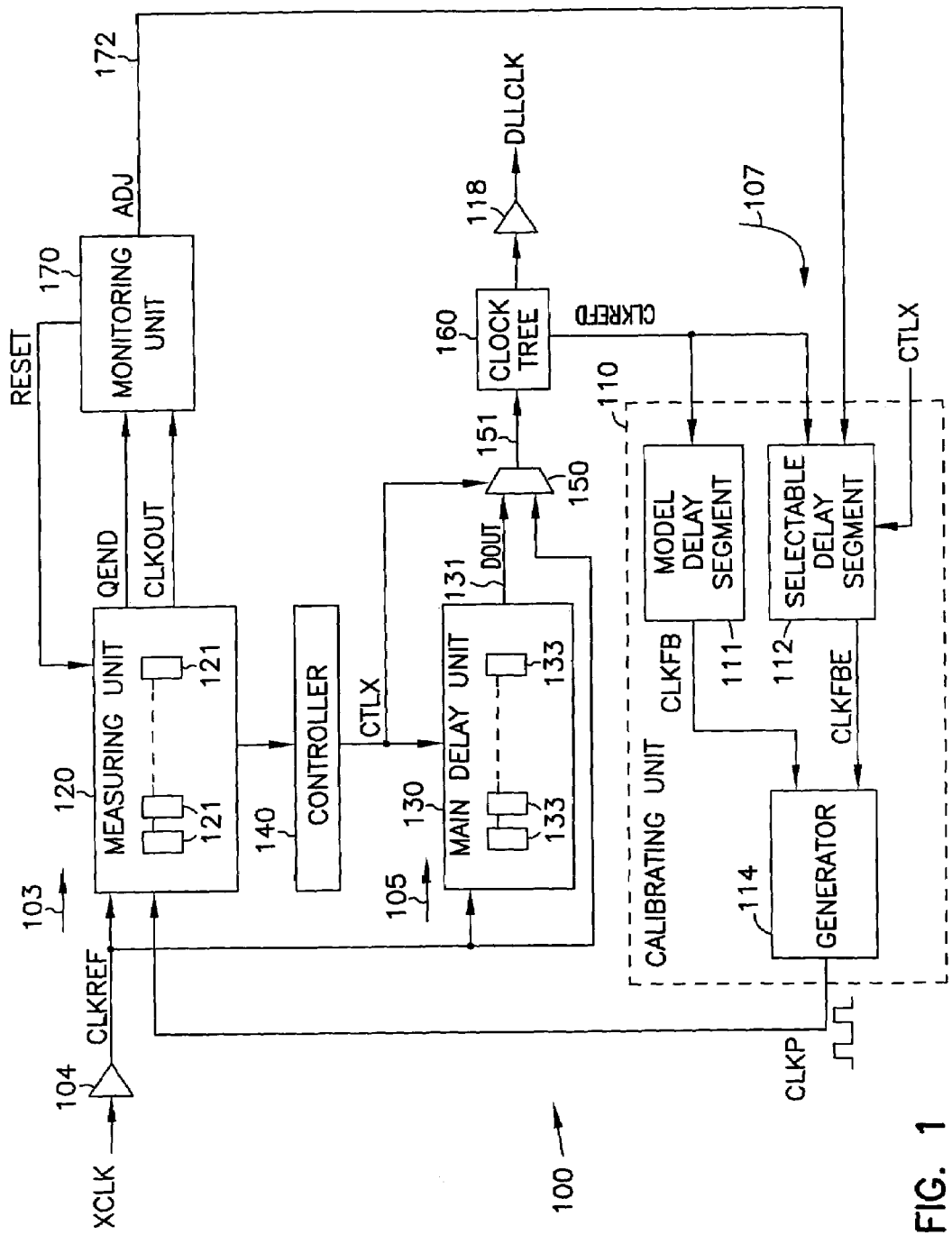
FIG. 1 shows a delay lock circuit according to an embodiment of the invention.

The following description and the drawings illustrate specific embodiments of the invention sufficiently to enable those skilled in the art to practice the invention. Other embodiments may incorporate structural, logical, electrical, process, and other changes. In the drawings, like numerals describe substantially similar components throughout the several views. Examples merely typify possible variations. Portions and features of some embodiments may be included in or substituted for those of others. The scope of the invention encompasses the full ambit of the claims and all available equivalents.

FIG. 1 shows a delay lock circuit according to an embodiment of the invention. Delay lock circuit 100 receives an external clock signal XCLK and generates an internal clock signal DLLCLK. The XCLK signal propagates through an input buffer 104 and becomes a reference signal CLKREF. Thus, the CLKREF signal is a version of the XLCK signal delayed by a time delay equal to the time delay of input buffer 104.

The CLKREF signal propagates through several signal paths including a measuring path 103, a forward path 105, and a feedback path 107.

Feedback path 107 includes a calibrating unit 110 for generating a calibrating signal CLKP based on feedback timing information of the CLKREF signal on feedback path 107. The CLKP signal includes one or more pulses as shown in FIG. 1. In some embodiments, the pulses of the CLKP signals have unequal pulse widths.

Measuring path 103 includes a measuring unit 120 for performing a measurement on the CLKP signal. A controller 140 obtains the result of the measurement. The result of the measurement represents a time delay, which is called a measured delay. Measuring unit 120 includes a chain of measuring delay elements 121. The measured delay is a time delay equal to the time delay of a number of measuring delay elements 121. Thus, the measured delay corresponds to a number of measuring delay elements 121. Measuring path 103 further includes a monitoring unit 170 for monitoring the measurement performed by measuring unit 20.

Forward path 105 includes a main delay unit 130 for applying a delay (main delay) to the CLKREF signal to generate the DLLCLK signal. The main delay is based on the measured delay. Main delay unit includes a chain of main delay elements 133, which are similar to delay elements 121 of measuring unit 120. The main delay is a time delay equal to the time delay of a number of main delay elements 133 within main delay unit 130. Thus, the main delay corresponds to a number of main delay elements 133. The number of main delay elements 133 corresponding to the main delay is equal to the number of measuring delay elements 121 corresponding to the measured delay. Forward path 105 further includes a selector 150, a clock tree 160, and an output buffer 118.

Delay lock circuit 100 has an initialization process to obtain the measured delay to adjust the relationship between the XCLK and DLLCLK signals. In some embodiments, the XCLK and DLLCLK signals are not synchronized at the beginning of the initialization. Based on the measured delay measured by measuring unit 120, main delay unit 130 applies the main delay to the CLKREF signal to synchronize the XCLK and DLLCLK signals. Delay lock circuit 100 is locked (or in a locked position) after the measured delay is obtained and after main delay unit 130 applies the main delay (equal to the measured delay) to the CLKREF signal so that the XCLK and DLLCLK signals are synchronized.

Calibrating unit 110 of feedback path 107 includes a model delay segment 111, a selectable delay segment 112, and a generator 114. Model delay segment 111 delays a signal CLKREFD on feedback path 107 and provides a feedback signal CLKFB. Selectable delay segment 112 also delays the signal CLKREFD and provides a feedback signal CLKFBE. The CLKREFD signal is the CLKREF signal after the CLKREF signal propagates through selector 150 and clock tree 160. The CLKFBE and CLKFB signals are different delayed versions of the CLKREFD signal. The CLKFBE signal is the CLKREFD signal delayed by a first amount of delay. The CLKFB signal is the CLKREFD signal delayed by a second amount of delay unequal to the first amount of delay. Further, since the CLKREF signal is a delayed version of the XCLK signal and the CLKFBE and CLKFB signals are generated from the CLKREF signal, the CLKFBE and CLKFB signals are also delayed versions of the XCLK signal.

Clock tree 160 distributes signals to other components besides delay lock circuit 100. The signals distributed by clock tree 160 may be used as clock signal. For example, the DLLCLK signal is one of the signals distributed by clock tree 160.

Model delay segment 111 has a number of delay elements to delay a signal by a time delay equal to the sum of the time delays caused by input buffer 104 and output buffer 118.

Selectable delay segment 112 has a number of delay elements. The difference in time delay between the CLKFB and CLKFBE signals is equal to the delay time of a portion of the number of the delay elements of selectable delay segment 112.

Selector 150 may be a multiplexer having input nodes for receiving two signals including the DOUT signal and the CLKREF signal. The DOUT signal is a signal at an output node 131 of main delay unit 130. At the beginning of the initialization, selector 150 selects the CLKREF signal as the signal at an output node 151 of selector 150. After the measured delay is obtained, selector 150 selects the DOUT signal as the signal at output node 151.

Selector 150 is controlled by the states (signal levels) of a control signal CLTX. At the beginning of the initialization, the CTLX signal has a first state (e.g., low) to allow selector 150 to select the CLKREF signal to output node 151. After the initialization, the CTLX signal has a second state (e.g., high) to allow selector 150 to select the DOUT signal to output node 151.

Monitoring unit 170 monitors a condition of the measuring unit 120 based on an end of line signal QEND and a propagation output signal CLKOUT. The QEND signal is activated (e.g., from low to high) when delay lock circuit 100 is not locked after a measurement by measuring unit 120. The QEND signal is also activated when delay lock circuit 100 is locked after a measurement but a phase error exits between the CLKREF and CLKFB signals. The CLKOUT signal is activated to indicate that a pulse of the CLKP signal has propagated through the entire measuring unit 120. Monitoring unit 170 generates an adjust signal ADJ and a reset signal RESET based on the QEND and CLKOUT signals. The RESET signal resets measuring unit 120 to an initial state. The ADJ signal enables calibrating unit 110 to adjust the CLKP signal during the initialization. The ADJ signal represents one or more signals. In some embodiments, the ADJ signal represents one or more analog signals. In other embodiments, the ADJ signal represents one or more digital signals. In FIG. 1, line 172 represents one or more lines to carry one or more analog signals or to carry one or more digital signals.

During the initialization, monitoring unit 170 monitors the condition of measuring unit 120 while the CLKP signal is sampled by measuring unit 120 using the CLKREF signal. Measuring unit 120 uses the CLKREF signal to mark the number of measuring delay elements 121 that a pulse of the CLKP signal has propagated through. In some embodiments, measuring unit 120 includes latches. During the initialization, the CLKREF signal triggers a particular number of the latches to mark the number of measuring delay elements 121 that a pulse of the CLKP signal has propagated through. The number of measuring delay elements 121 that are marked corresponds to the measured delay. Controller 140 activates the CTLX signal when the measured delay is successfully obtained during the sampling. At main delay unit 130, the activated CLTX signal allows the CLKREF signal to enter the chain of main delay elements 133 at an entry point. From the entry point, the CLKREF signal propagates through a number main delay elements 133 to become the DOUT signal. The activated CLTX signal also enables selector 150 to pass the DOUT signal to node 151 and subsequently to output buffer 118. At the output node of output buffer 118, the DOUT signal becomes the DLLCLK signal.

Monitoring unit 170 activates the ADJ signal during the initialization when the measured delay is not successfully obtained. When the ADJ signal is activated, calibrating unit 110 adjusts the CLKP signal by generating a new pulse with a pulse width different than the pulse width used in the previous measurement. Depending on the condition of measuring unit 120 when the ADJ signal is activated, the pulse width of the new pulse for a new measurement is either smaller or greater than the pulse width of the previous pulse used in the previous measurement. Monitoring unit 170 also activates the RESET signal to reset measuring unit 120 to an initial state. The measurement is repeated with the new pulse.

In some cases, the manufacturing process, voltage, and temperature variations may cause delay lock circuit 100 to unsuccessfully obtain the measured delay in an initial measurement. Modifying the pulse width of the pulse of the CLKP signal in subsequent measurements after the initial measurement allows the measured delay to be obtained during the initialization so that the DLLCLK signal can be eventually generated and synchronized with the XCLK signal.

Figure 2:
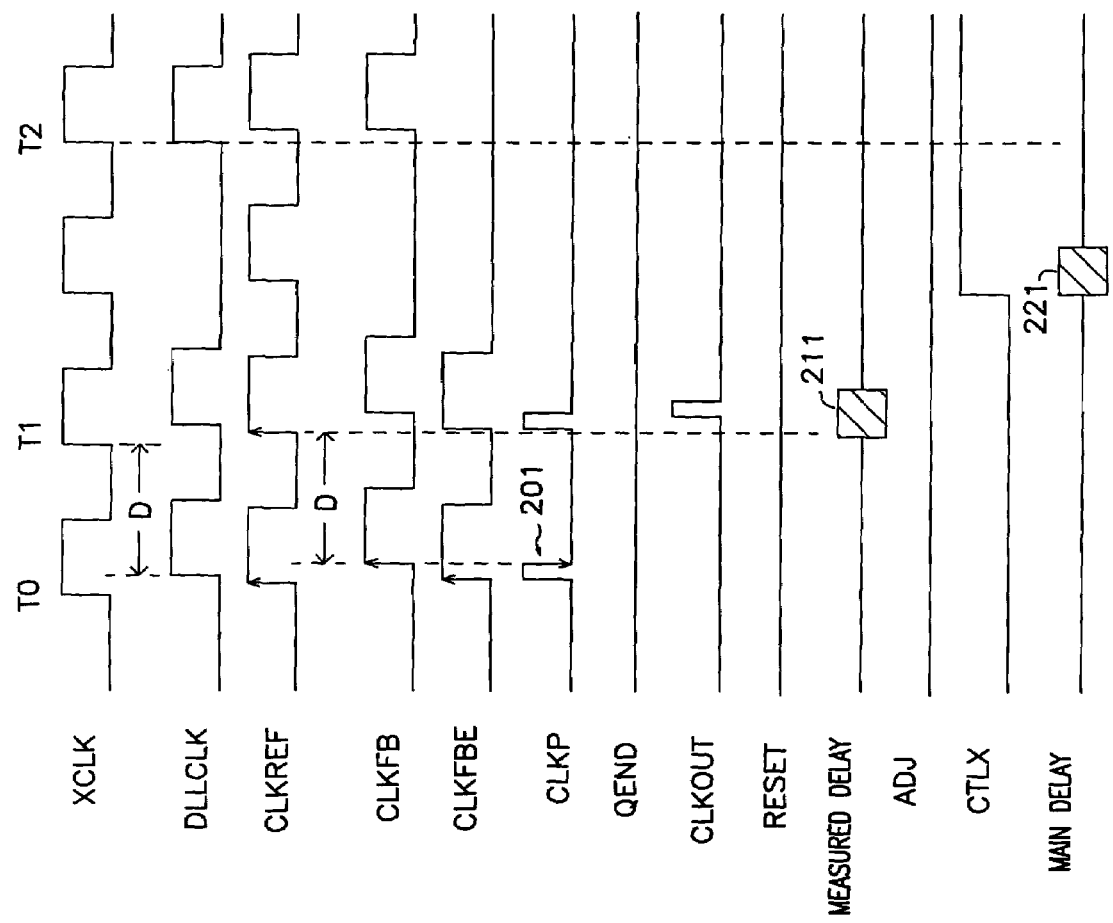
FIG. 2 is an exemplary timing diagram for the delay lock circuit of FIG. 1.

FIG. 2 is an exemplary timing diagram for the delay lock circuit 100 of FIG. 1. Between times T0 and T2, the XCLK and DLLCLK signals are not synchronized. A delay D indicates a time delay needed to synchronize the XCLK and DLLCLK signals. The CLKP signal has an initial pulse 201 generated based on the CLKFB and CLKBE signals. A measured delay 211 is obtained after time T1. Measured delay 211 is a time delay corresponding to the delay D. After measured delay 211 is obtained, between time T1 and T2, controller 140 activates the CTLX signal. In response to the CTLX signal, main delay unit 110 applies a main delay 221 in main delay unit 130. The XCLK and the DLLCLK signals are synchronized at time T2 and delay lock circuit 100 is locked. After the CTLX signal is activated, the CLKFBE and CLKP signals are deactivated.

FIG. 2 shows three cycles of the XCLK signal between times T0 and T2 as an example. In some embodiments, more than three cycles of the XCLK signal may occur between times T0 and T2.

In the exemplary timing diagram of FIG. 2, the CTLX signal is activated to indicate that the measured delay is successfully obtained when pulse 201 is sampled. When the CTLX signal is activated, the QEND and RESET signals are not activated. Thus, the ADJ signal is also not activated. Therefore, no adjustment to the pulse width of pulse 201 is performed.

In some embodiments, delay lock circuit 100 is configured such that initial pulse 201 has an initial pulse width equal to a time delay of one delay element 121 or 133 of FIG. 1. Setting the initial pulse width equal to a time delay of one delay element 121 or 133 reduces or eliminates the phase error between the XCLK and the DLLCLK signals when delay lock circuit 100 is locked. In FIG. 2, the initialization successfully synchronizes the XCLK and DLLCK signals and locks delay lock circuit 100 without modifying the pulse width of the initial pulse 201.

Figure 3A:
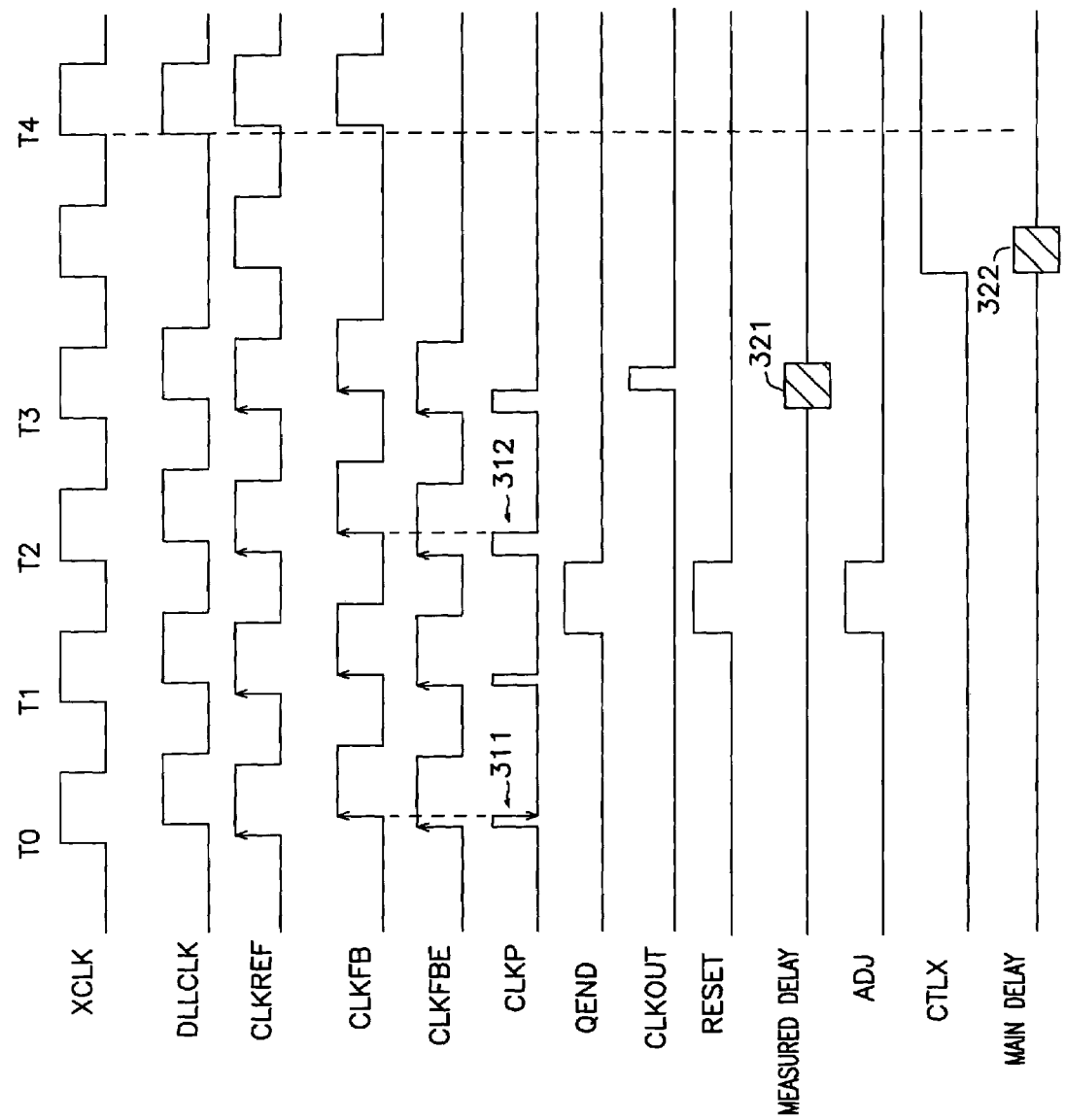
FIG. 3A is an exemplary timing diagram for the delay lock circuit of FIG. 1 having an initial pulse with a narrow pulse width.
Figure 3B:
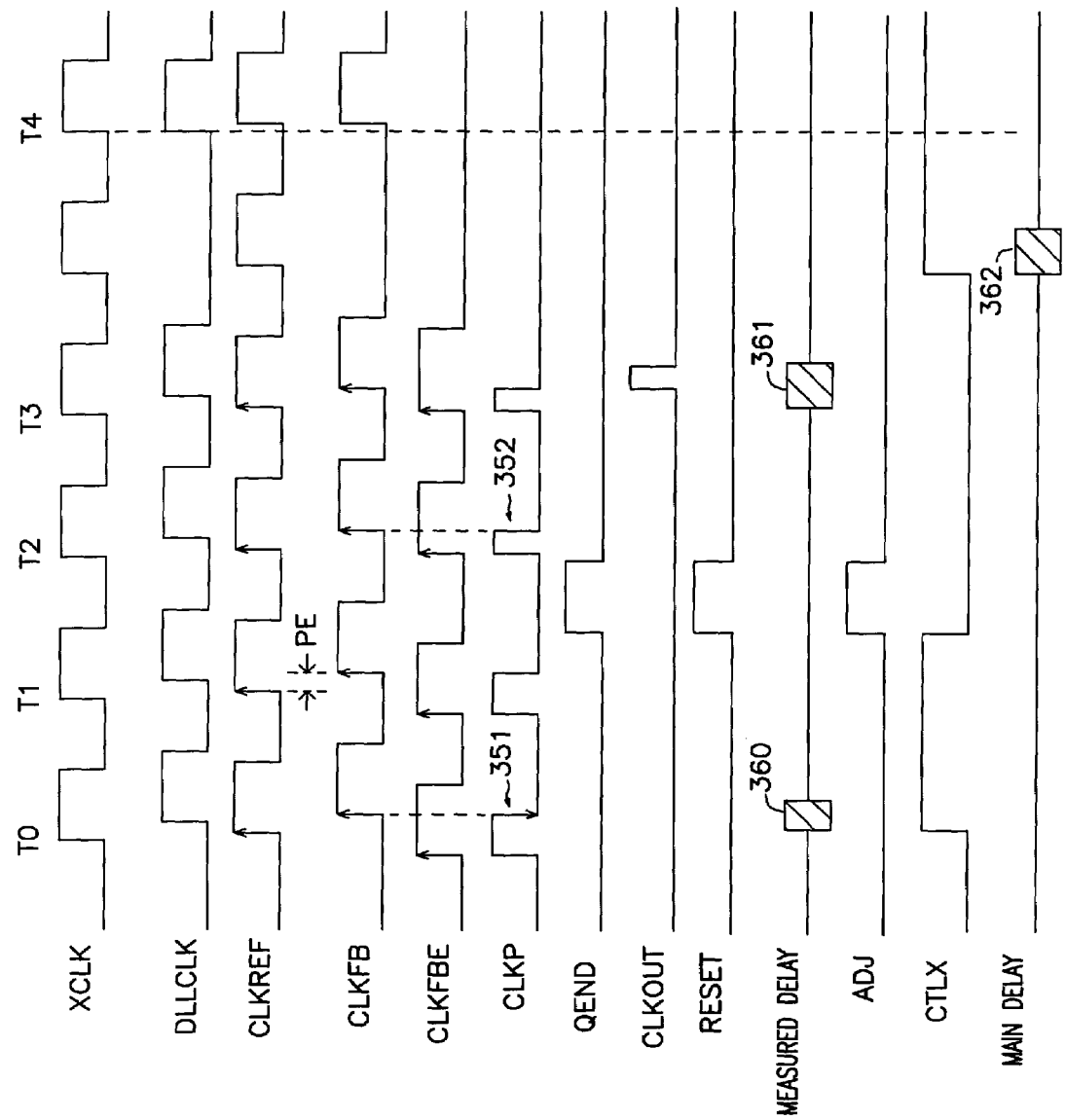
FIG. 3B is an exemplary timing diagram for the delay lock circuit of FIG. 1 having an initial pulse with a wide pulse width.

In some cases, the manufacturing process, voltage, and temperature variations may cause the pulse width of initial pulse 201 at time T0 to be either narrower or wider. Delay lock circuit 100 is configured to adjust the initial pulse having either the narrow pulse width or the wide pulse width. FIG. 3A and FIG. 3B below show exemplary timing diagrams for delay lock circuit 100 having an initial pulse with a narrow pulse width and an initial pulse with a wide pulse width.

FIG. 3A is an exemplary timing diagram for the delay lock circuit 100 of FIG. 1 having an initial pulse with a narrow pulse width. In FIG. 3A, the measured delay is unsuccessfully obtained between times T0 and T2 during a measurement of initial pulse 311. Thus, delay lock circuit 100 is not locked. A new pulse 312 is generated with a pulse width greater than the pulse width of pulse 311. Thus, the pulse width of the pulse of the CLKP signal is adjusted.

Between times T1 and T2, the QEND signal is activated indicating delay lock circuit 100 is not locked after the measurement between times T0 and T1. The CLKOUT signal is not activated between time T0 and T2 indicating that pulse 311 disappears inside measuring unit 120. A narrow pulse width may cause pulse 311 to disappear inside measuring unit. When the QEND signal is activated, the ADJ signal is activated to adjust the pulse width of pulse 311. Calibrating unit 110 (FIG. 1) adjusts the pulse width of pulse 311 by generating the new pulse 312 with a pulse width greater than the pulse width of pulse 311. The RESET signal is activated to reset measuring unit 120 so that a new measurement can be performed on the new pulse 312. Between times T3 and T4, delay lock circuit 100 continues the initialization. A measured delay 321 is obtained based the measurement of pulse 312. The CTLX signal is activated. A main delay 322 is applied to allow the XCLK and DLLCLK to be synchronized at time T4. After the CTLX signal is activated, the CLKFBE and CLKP signals are deactivated.

FIG. 3A shows five cycles of the XCLK signal between times T0 and T4 as an example. In some embodiments, more than five cycles of the XCLK signal may occur between times T0 and T4.

FIG. 3B is an exemplary timing diagram for the delay lock circuit 100 of FIG. 1 having an initial pulse with a wide pulse width. FIG. 3B describes a situation in which delay circuit 100 is locked with the entry point of the CLKREF signal into main delay unit 130 at one of the delay elements 133 (e.g., the first delay element) such that a phase error occurs between the CLKREF and CLKFB signals.

Delay lock circuit 100 is configured to reduce the time spent to correct the phase error by adjusting (e.g., reducing) the pulse width during the initialization. In FIG. 3B, a measured delay 360 is obtained between times T0 and T1 during a measurement of pulse 351. A phase error, indicated by PE, exists between the CLKREF and CLKFB signals because the entry point to measuring delay unit 120 and main delay unit 130 may be located at the first delay element 121 of measuring delay unit 120 and at the first delay element 133 of main delay unit 130. To correct the phase error, between times T1-T2, the ADJ signal is activated to adjust (e.g., reduce) the width of pulse 351. The RESET signal is also activated to reset measuring unit 120 to prepare for another measurement using a new pulse. The activated RESET signal also resets the state of the CTLX signal.

At time T2, a new pulse 352 is generated. Pulse 352 has a pulse width smaller than the pulse width of pulse 351. Between times T2 and T4, the process is similar to the process between times T0-T2 of FIG. 2. A new measured delay 361 is obtained based on the measurement of pulse 352. The CTLX signal is activated. A main delay 362 is applied to allow the XCLK and DLLCLK to be synchronized at time T4. After the CTLX signal is activated, the CLKFBE and CLKP signals are deactivated.

FIG. 3B shows five cycles of the XCLK signal between times T0 and T4 as an example. In some embodiments, more than five cycles of the XCLK signal may occur between times T0 and T4.

Figure 4:
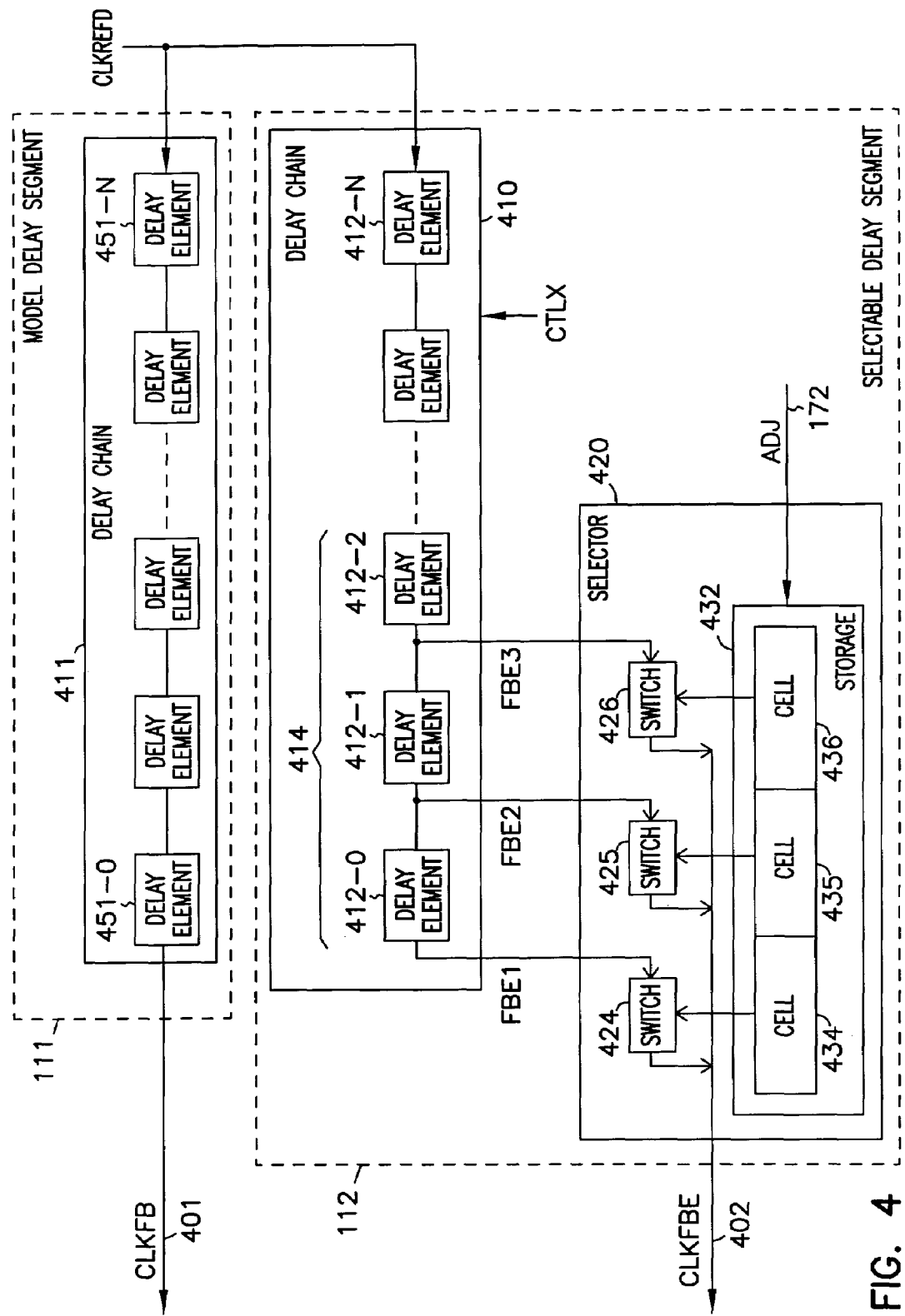
FIG. 4 shows a circuit diagram of a portion of a calibrating unit according to an embodiment of the invention.

FIG. 4 shows a circuit diagram of a portion of calibrating unit 110 of FIG. 1. In FIG. 4, model delay segment 111 has an input node to receive the CLKREFD signal and an output node 401 to provide the CLKFB signal. Model delay segment 111 includes a delay chain 411 having a number of delay elements 451 (451-0 through 451-N) for delaying the CLKREFD signal. The CLKFB signal is the CLKREFD signal delayed by an amount of delay equal to the sum of the delays caused by all of the delay elements 451. In some embodiments, model delay segment 111 further includes elements similar to input buffer 104 and output buffer 118 (FIG. 1) for delaying the CLKREFD signal before the CLKREFD signal is provided to delay element 451-N.

Selectable delay segment 112 includes a delay chain 410 and a selector 420. Delay chain 410 has an input node to receive the CLKREFD signal, and a number of selectable output nodes to provide a number of selectable signals (or feedback signals) FBE1, FBE2, and FBE3. Selector 420 has a number of input nodes to receive the FBE1, FBE2, and FBE3 signals, and an output node 402 to provide the CLKFBE signal. The CLKFBE signal is the CLKREFD signal delayed by an amount of delay equal to a delay of a portion of the delay elements 412. In some embodiments, selectable delay segment 112 further includes elements similar to input buffer 104 and output buffer 118 (FIG. 1) for delaying the CLKREFD signal before the CLKREFD signal is provided to delay element 412-N.

Figure 5:
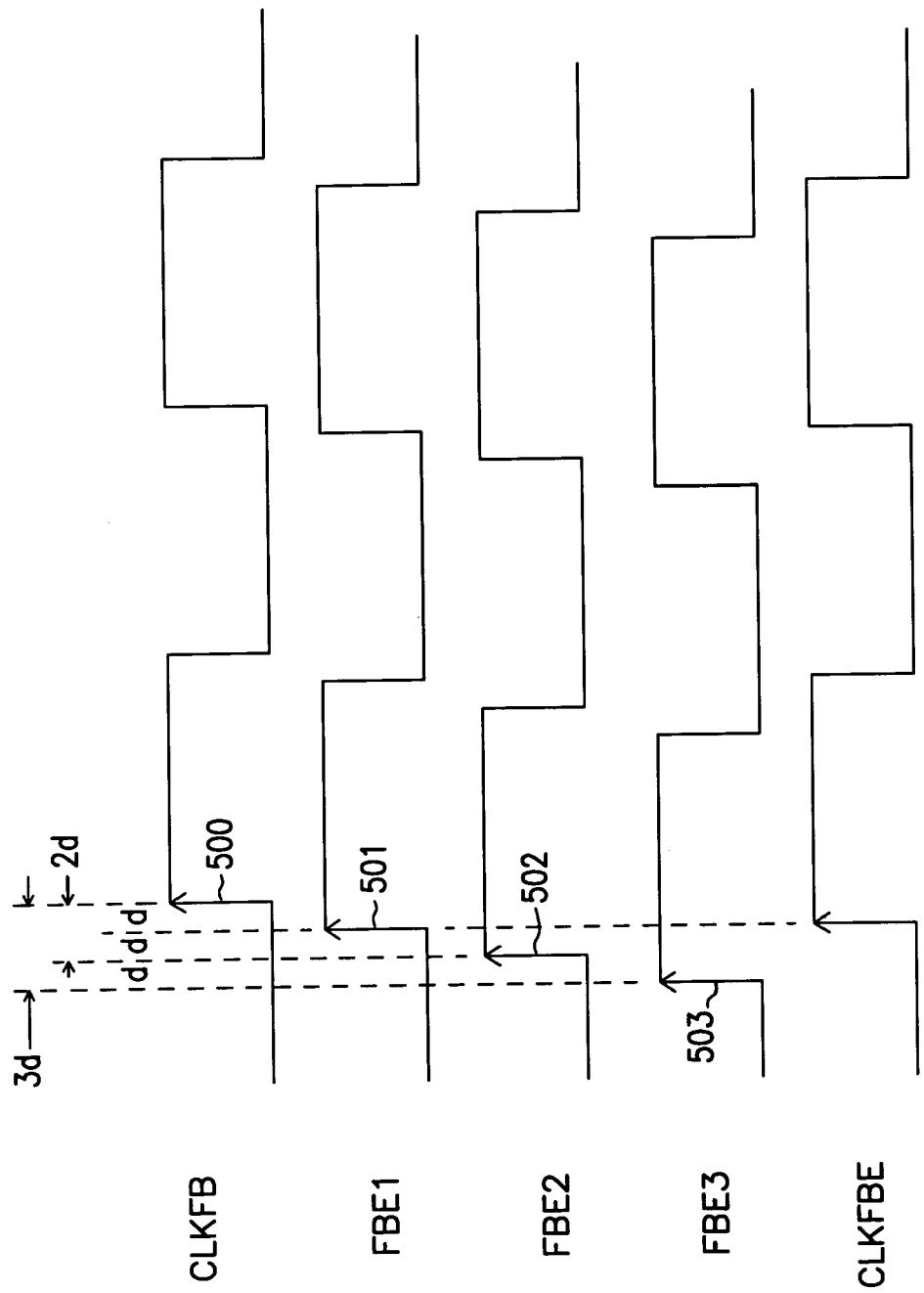
FIG. 5 shows the timing relationship among the signals of the circuit diagram of FIG. 4.

Delay chain 410 includes a number of delay elements 412 (412-0, 412-1, 412-2, 412-3 through 412-N). Delay chain 410 has a subset 414. Subset 414 includes a number of delay elements 412-0, 412-1, and 412-2. Each of the delay elements within subset 414 provides one of the signals FBE1, FBE2, and FBE3. In FIG. 4, subset 414 includes three delay elements to provide three feedback signals (FBE1, FBE2, and FBE3) as an example. In some embodiments, the number of delay elements in subset 414 may be different from three to provide a different number of feedback signals. FIG. 5 shows the relationships among the FBE1, FBE2, and FBE3 signals, the CLKFB signal, and the CLKFBE signal.

In FIG. 4, selector 420 includes a number of switches 424, 425, and 426, and a storage 432. Each of the switches 424, 425, and 426 connects to an output node of a corresponding delay element of subset 414 to pass one of the FBE1, FBE2, and FBE3 signals to node 402 to become the CLKFBE signal. In some embodiments, switches 424, 425, and 426 include transistors having gates controlled by the values stored in storage 432.

Storage 432 includes a number of cells 434, 435, and 436, each storing a value. Examples of the value stored in each of the cells 434, 435, and 436 include logic one (high) and logic zero (low). The values in cells 434, 435, and 436 control the states of switches 424, 425, and 426. For example, if cell 434 has a logic one and both cells 435 and 436 have a logic zero, switch 424 is activated and switches 425 and 426 are not activated. In this example, switch 424 passes the FBE1 signal to node 402. The FBE1 signal becomes the CLKFBE signal at node 402. The value in each of the cells 434, 435, and 436 is changed after each time the ADJ signal is activated.

In some embodiments, cells 434, 435, and 436 form a shift register having an initial value to control switches 424, 425, and 426 such that each time the ADJ signal is activated, a different one of the FB1, FBE2, and FBE3 signals is selected to be the CLKFBE signal. For example, when the FBE2 signal is initially selected to be the CLKFBE signal, after the ADJ signal is activated, either the FBE3 signal or the FBE1 signal is selected to be the CLKFBE signal.

In some embodiments, line 172 includes multiple lines to carry multiple signals (e.g. two different signals) and the shift register formed by cells 434, 435, and 436 is shifted right or left to select the FB1, FBE2, and FBE3 signals based on the combination of the multiple signals. For example, when FBE2 is initially selected to be the CLKFBE signal, after the ADJ signal is activated, the FBE1 signal is selected to be the CLKFBE signal if the multiple signals on lines 172 have a first combination, e.g., the multiple signals on lines 172 have the same state. Using the same example, the FBE3 signal (instead of the FBE1 signal) is selected to be the CLKFBE signal if the multiple signals have a second combination, e.g., the multiple signals on lines 172 have different states.

Monitoring unit 170 and controller 140 (FIG. 1) are configured to control the states of the multiple signals on lines 172. For example, controller 140 may include circuit elements to monitor the entry point of the CLKREF signal in measuring unit 120 and main delay unit 130. Based on the location of the entry point, controller 140 controls a state of one of the signals on multiple lines (172) such that cells 434, 453, and 436 enable switches 424, 425, and 426 to appropriately select the FBE1, FBE2, and FBE3 signals.

FIG. 5 shows the timing relationship among the signals of model delay segment 111 selectable delay segment 112 of FIG. 4. Label "d" represents a delay unit equal to a time delay of each of delay elements 412 (FIG. 4). Each of the FBE1, FBE2, and FBE3 signals has a rising edge occurred earlier than a rising of the CLKFB signal by a multiple of the unit delay "d". For example, rising edge 501 of the FBE1 signal occurs one delay unit "d" earlier than rising edge 500 of the CLKFB signal. Rising edge 502 of the FBE2 signal occurs "2d" earlier than rising edge 500 of the CLKFB signal. Rising edge 503 of the FBE3 signal occurs "3d" earlier than rising edge 500 of the CLKFB signal. As described above in FIG. 4, depending on the states of switches 424, 425, and 426, the CLKFBE signal in FIG. 5 is one of the FBE1, FBE2, and FBE3 signals. FIG. 5 shows the CLKFBE signal being the FBE1 signal as an example.

Figure 6:
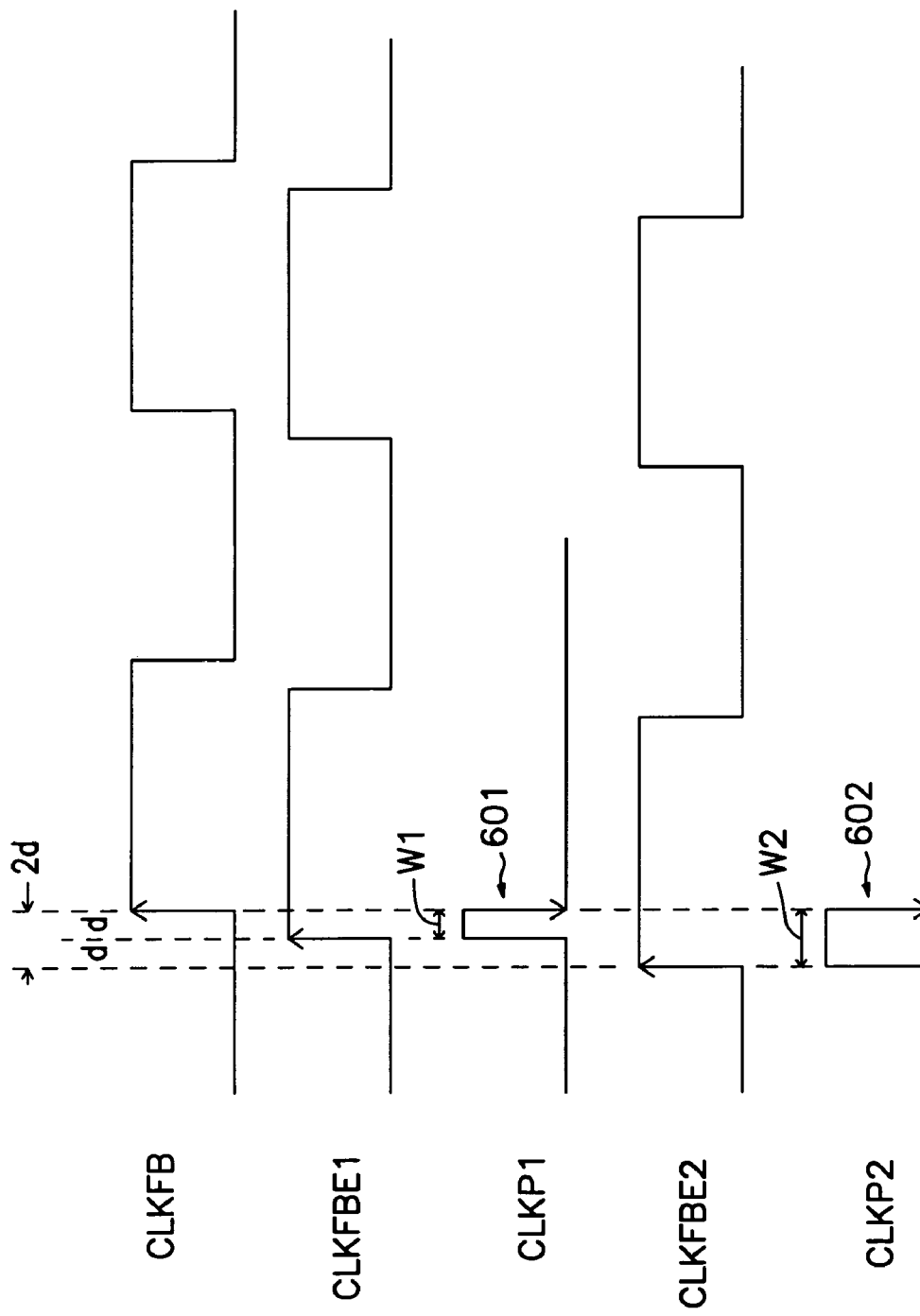
FIG. 6 shows the timing relationship among the signals of a generator.

FIG. 6 shows the timing relationship among the signals of generator 114 of FIG. 1. In FIG. 6, the CLKP1 and CLKP2 signals represent two exemplary cases for the CLKP signal of FIG. 1. Thus, the CLKP signal of FIG. 1 may be either the CLKP1 signal or the CLKP2 signal of FIG. 6.

The CLKP1 signal has a pulse 601 with a pulse width W1. The CLKP2 signal has a pulse 602 with a pulse width W2. W2 is greater than W1. Pulse 601 is generated from the CLKFB and the CLKFBE1 signals. Pulse 602 is generated from the CLKFB and the CLKFBE2 signals. The CLKFBE1 and CLKFBE2 signals correspond to the FBE1 and FBE2 signals of FIG. 4, respectively.

In FIG. 6, the CLKFBE1 signal has a rising edge occurred earlier than the rising edge of the CLKFB signal by one unit delay or one "d". As shown in FIG. 6, the pulse width W1 of pulse 601 is equal to one delay unit. The pulse width W2 of pulse 602 is equal to two delay units.

In FIG. 6, the falling edge of each of the CLKP1 and CLKP2 signals aligns or corresponds with the rising edge of the CLKFB signal. Generating the CLKP1 or CLKP2 signal with the falling edge aligned with the rising edge of the CLKFB signal reduces a phase error between the CLKFB and CLKREF signals so that the XCLK and DLLCLK is more accurately synchronized.

Figure 7:
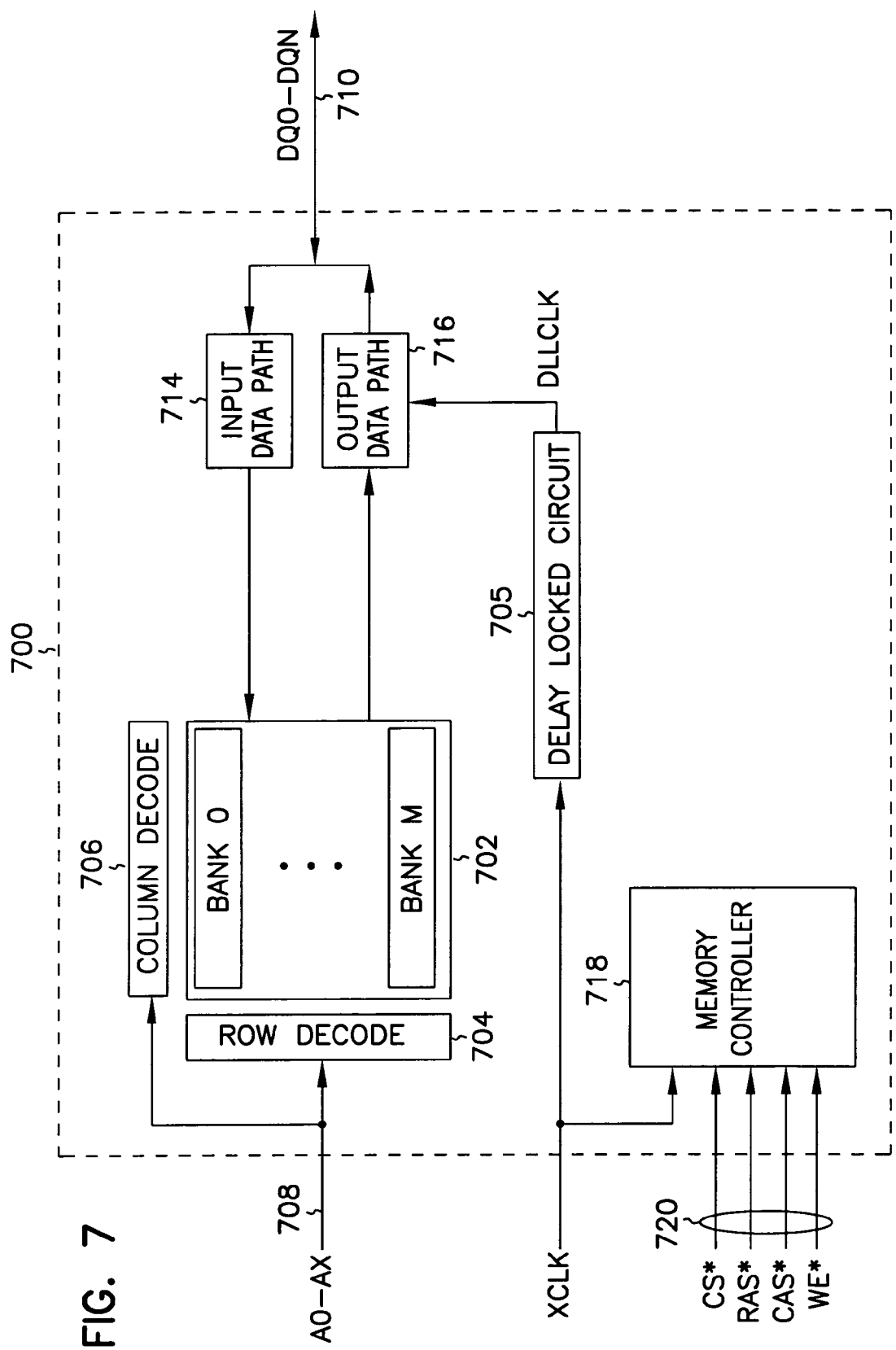
FIG. 7 shows a memory device according to an embodiment of the invention.

FIG. 7 shows memory device according to an embodiment of the invention. Memory device 700 includes a memory array 702 having plurality of memory cells arranged in rows and columns. The memory cells are grouped into a plurality of memory banks indicated by bank 0 through bank M (banks 0-M). Row decode 704 and column decode 706 access the memory cells in response to address signals A0 through AX (A0-AX) on address lines (or address bus) 708. A data input path 714 and a data output path 716 transfer data between banks O-M and data lines (or data bus) 710. Data lines 710 carry data signals DQ0 through DQN (DQ0-DQN). A memory controller 718 controls the modes of operations of memory device 700 based on control signals on control lines 720. The control signals include, but are not limited to, a Chip Select signal CS*, a Row Access Strobe signal RAS*, a Column Access Strobe CAS* signal, a Write Enable signal WE*, and an external signal XCLK.

Memory device 700 further includes a delay lock circuit 705 for delaying the XCLK signal to generate an internal signal DLLCLK. The DLLCLK signal serves as a clock signal to control a transfer of data on data output path 716. Delay lock circuit 705 includes embodiments of delay lock circuit 100 (FIG. 1). In some embodiments, the XCLK signal is provided to memory device from an external source externally to memory device 700.

Memory device 700 may be a dynamic random access memory (DRAM) device. Examples of DRAM devices include synchronous DRAM commonly referred to as SDRAM, SDRAM II, SGRAM (Synchronous Graphics Random Access Memory), DDR SDRAM (Double Data Rate SDRAM), DDR II SDRAM, DDR III SDRAM, GDDR III SDRAM (Graphic Double Data Rate), and Rambus DRAM devices. Memory device 700 includes other elements, which are not shown for clarity.

Figure 8:
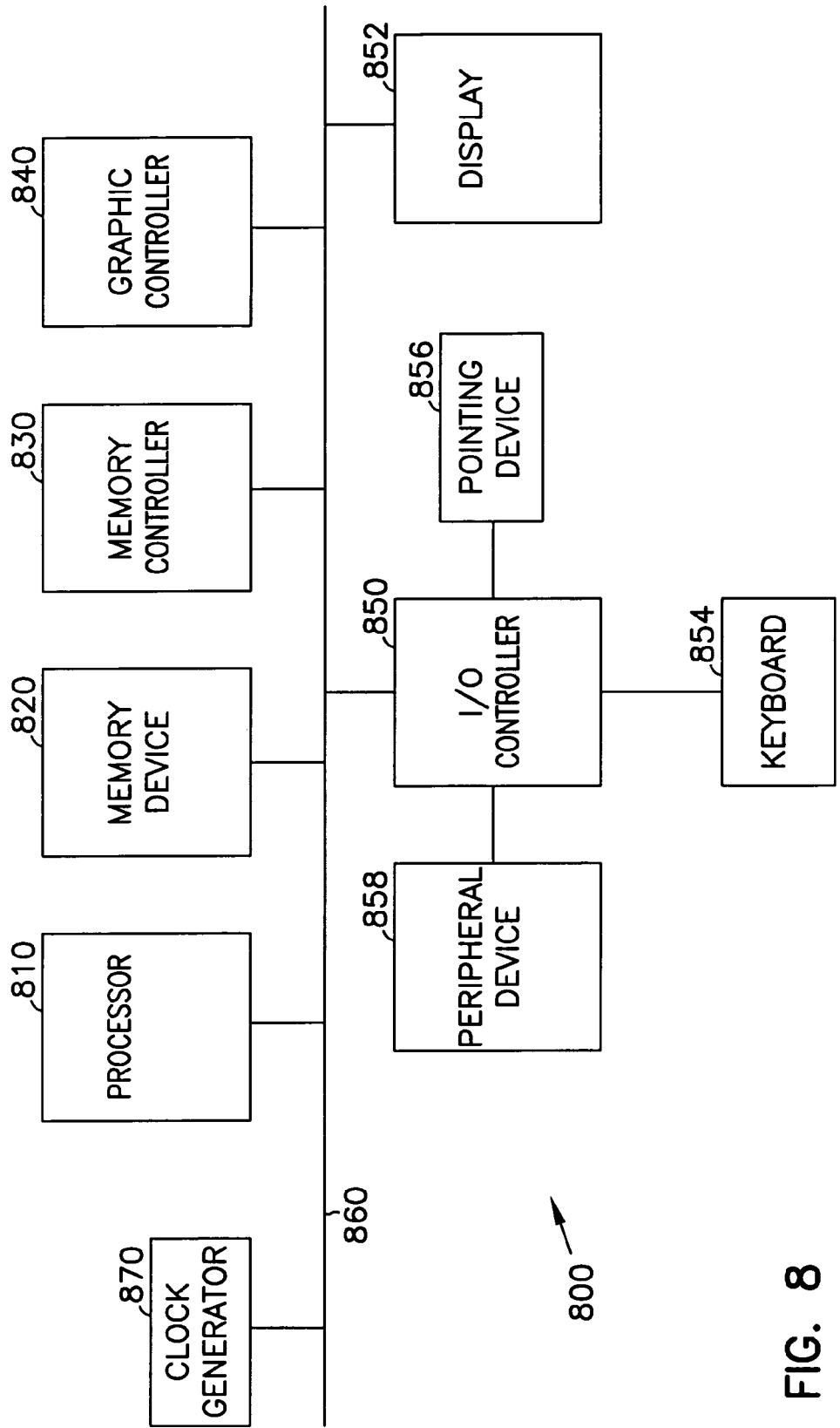
FIG. 8 shows a system according to an embodiment of the invention.

FIG. 8 shows a system 800. System 800 includes a processor 810, a memory device 820, a memory controller 830, a graphic controller 840, and an input and output (I/O) controller 850, a display 852, a keyboard 854, a pointing device 856, and a peripheral device 858. A bus 860 couples all of these devices together. A clock generator 870 provides a clock signal to at least one of the devices of system 800 via bus 860. An example of clock generator 870 includes an oscillator in a circuit board such as a motherboard. Two or more devices shown in system 800 may be formed in a single chip.

Memory device 820 includes memory device 700 (FIG. 7). Further, at least one of the devices shown in system 800 includes delay lock circuit such as delay lock circuit 100 (FIG. 1).

Bus 860 may be interconnect traces on a circuit board or may be one or more cables. Bus 860 may also couple the devices of system 800 by wireless means such as by electromagnetic radiations, for example, radio waves. Peripheral device 858 may be a printer, an optical device such as CD-ROM and DVD reader and writer, a magnetic device reader and writer such as a floppy disk driver, or an audio device such as a microphone.

System 800 represented by FIG. 8 includes computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

CONCLUSION

Various embodiments of the invention provide a delay lock circuit for generating an internal signal based on an external signal. The delay lock circuit includes a calibrating unit to conditionally adjust a pulse width of a pulse. During an initialization process, the delay lock circuit performs a measurement on the pulse to put the internal and external signals in synchronization. Although specific embodiments are described herein, those skilled in the art recognize that other embodiments may be substituted for the specific embodiments shown to achieve the same purpose. This application covers any adaptations or variations of the present invention. Therefore, the present invention is limited only by the claims and all available equivalents.

What is claimed is:

1. A method comprising:
generating a pulse with an initial pulse width, wherein generating the pulse includes delaying a reference signal to generate a first feedback signal and a second feedback signal, generating a first edge of the pulse using the first feedback signal, and generating a second edge of the pulse using the second feedback signal, and wherein the first and second feedback signals have different timing relationships with each other;
sampling the pulse with the reference signal in an initial measurement to obtain a measured delay;
conditionally adjusting the initial pulse width; and
delaying the reference signal based on the measured delay to generate an internal signal.

2. The method of claim 1, wherein
delaying the reference signal includes propagating the reference signal through a number of first delay elements to generate the first feedback signal, and propagating the reference signal through a number of second delay elements to generate the second feedback signal.

3. The method of claim 1, wherein conditionally adjusting the initial pulse width includes:
generating a second pulse with a pulse width greater than the initial pulse width if the measured delay is not obtained in the initial measurement; and
sampling the second pulse with the reference signal in a second measurement to obtain the measured delay if the measured delay is not obtained in the initial measurement.

4. The method of claim 1, wherein conditionally adjusting the initial pulse width includes increasing the initial pulse width.

5. The method of claim 1, wherein conditionally adjusting the initial pulse width includes decreasing the initial pulse width.

6. The method of claim 1, wherein
delaying the reference signal includes delaying the reference signal using a first delay chain to generate the first feedback signal and delaying the reference signal using a second delay chain to generate the second feedback signal.

7. The method of claim 6, wherein the first edge of the pulse is generated based on a rising edge of the first feedback signal, and wherein the second edge of the pulse is generated based on a rising edge of the second feedback signal.

8. The method of claim 1, wherein a duration of the pulse width is a function of a timing difference between the reference signal the internal signal.

9. The method of claim 1, wherein conditionally adjusting the initial pulse width is performed if the measured delay is not obtained in the initial measurement.

10. The method of claim 9, wherein conditionally adjusting the initial pulse includes performing one of increasing the initial pulse width and deceasing the initial pulse width.

11. The method of claim 1, wherein delaying the reference signal based on the measured delay includes applying a main delay to the reference signal, and wherein each of the main delay and the measured delay corresponds to a number of delay elements used in the initial measurement to obtain the measured delay.

12. A method comprising:
receiving a reference signal;
using the reference signal to sample a pulse on a measuring path to obtain a measured delay;
delaying the reference signal on a forward path based on the measured delay to generate an internal signal;
generating the pulse based on a delay of the reference signal on a feedback path, wherein generating the pulse includes delaying the reference signal on the feedback path to generate a first feedback signal and a second feedback signal, generating a first edge of the pulse using the first feedback signal, and generating a second edge of the pulse using the second feedback signal, and wherein the first and second feedback signals have different timing relationships with each other; and
conditionally adjusting a pulse width of the pulse for adjusting the measured delay.

13. The method of claim 12, wherein delaying the reference signal on the forward path includes applying a main delay to the reference signal, and wherein the main delay and the measured delay are provided by an equal number of delay elements of the measuring path and the forward path.

14. The method of claim 12, wherein generating the pulse includes:
propagating the reference signal on a first delay segment of the feedback path to generate the first feedback signal;
propagating the reference signal on a second delay segment of the feedback path to generate the second feedback signal; and
generating the first and second edges of the pulse based on timing of the first and second feedback signals.

15. The method of claim 14, wherein the first delay segment is a fixed delay segment, and wherein the second delay segment is an adjustable delay segment.

16. The method of claim 15, wherein conditionally adjusting the pulse width includes adjusting a delay of the second delay segment to increase the pulse width.

17. The method of claim 14, wherein generating the first and second edges of the pulse includes:
generating a first edge of the pulse based on an edge of the first feedback signal; and
generating a second edge of the pulse based on an edge of the second feedback signal.

18. The method of claim 17, wherein conditionally adjusting the pulse width includes adjusting a delay of the second delay segment to decrease the pulse width.

19. A method comprising:
receiving a reference signal;
generating a plurality of feedback signals based on the reference signal;
generating a pulse based on the feedback signals, wherein generating the pulse includes delaying the reference signal to generate a first feedback signal of the plurality of feedback signals and a second feedback signal of the plurality of feedback signals, generating a first edge of the pulse using the first feedback signal, and generating a second edge of the pulse using the second feedback signal, and wherein the first and second feedback signals have different timing relationships with each other;
propagating the pulse on a measuring path during a measurement to obtain a measured delay;
applying a main delay to the reference signal on a forward path to generate an internal signal;
monitoring the measurement; and
adjusting a pulse width of the pulse based on the monitoring to adjust the timing relationship between the internal signal and the reference signal.

20. The method of claim 19, wherein the main delay is equal to the measured delay.

21. The method of claim 19, wherein generating the plurality of feedback signals includes:
propagating the reference signal on a first delay segment to generate the first feedback signal; and
propagating the reference signal on a second delay segment to generate the second feedback signal.

22. The method of claim 21, wherein generating the pulse includes:
generating the first edge of the pulse based on an edge of the first feedback signal; and
generating the second edge of the pulse based on an edge of the second feedback signal.

23. The method of claim 22, wherein the first delay segment is a fixed delay segment, and wherein the second delay segment is an adjustable delay segment.

24. The method of claim 23, wherein adjusting the pulse width includes increasing a delay of the second delay segment.

25. The method of claim 23, wherein adjusting the pulse width includes decreasing a delay of the second delay segment.

26. The method of claim 19, wherein monitoring includes resetting the measuring path after each time the pulse width is adjusted.

27. The method of claim 26, wherein monitoring includes activating a signal to indicate a completion of a propagation of the pulse through the measuring path.

28. A method comprising:
receiving a reference signal at a memory device;
generating a pulse based on a delay of the reference signal on a feedback path, wherein generating the pulse includes delaying the reference signal to generate a first feedback signal and a second feedback signal, generating a first edge of the pulse using the first feedback signal, and generating a second edge of the pulse using the second feedback signal, and wherein the first and second feedback signals have different timing relationships with each other;
propagating the pulse on a measuring path during a measurement to obtain a measured delay;
delaying the reference signal on a forward path based on the measured delay to generate an internal signal;
conditionally adjusting a pulse width of the pulse to synchronize the internal signal with the reference signal; and
transferring data on a data output path of the memory device based on timing of the internal signal.

29. The method of claim 28, wherein generating the pulse includes:
propagating the reference signal on a first delay segment of the feedback to generate the first feedback signal;
propagating the reference signal on a second delay segment to generate the second feedback signal; and
generating edges of the pulse based on timing of the first and second feedback signals.

30. The method of claim 29, wherein generating the pulse includes:
generating the first edge of the pulse based on a rising edge of the first feedback signal; and
generating a second edge of the pulse based on a rising edge of the second feedback signal.

31. The method of claim 29, wherein the first delay segment is a fixed delay segment, and wherein the second delay segment is an adjustable delay segment.

32. The method of claim 31, wherein adjusting the pulse width includes increasing a delay of the second delay segment.

33. The method of claim 31, wherein adjusting the pulse width includes decreasing a delay of the second delay segment.

34. The method of claim 31, wherein measuring path is reset after each time the pulse width is adjusted.

* * * * *

UNITED STATES PATENT AND TRADEMARK OFFICE
CERTIFICATE OF CORRECTION

PATENT NO. : 7,336,084 B2 Page 1 of 1
APPLICATION NO. : 11/215987
DATED : February 26, 2008
INVENTOR(S) : Lin It is certified that error appears in the above-identified patent and that said Letters Patent is hereby corrected as shown below:

In column 10, line 35, in Claim 8, after "signal" insert -- and --.

In column 10, line 41, in Claim 10, delete "deceasing" and insert -- decreasing --, therefor.

Signed and Sealed this

Third Day of June, 2008

JON W. DUDAS
*Director of the United States Patent and Trademark Office*